United States Patent
Newman

(10) Patent No.: US 10,830,813 B1
(45) Date of Patent: Nov. 10, 2020

(54) ELECTROSTATIC DISCHARGE VERIFICATION DURING BIOMETRIC SCAN FOR TERMINAL LOGIN

(71) Applicant: IGT, Las Vegas, NV (US)

(72) Inventor: Garett Newman, Reno, NV (US)

(73) Assignee: IGT, Las Vegas, NV (US)

(*) Notice: Subject to any disclaimer, the term of this patent is extended or adjusted under 35 U.S.C. 154(b) by 0 days.

(21) Appl. No.: 16/407,357

(22) Filed: May 9, 2019

(51) Int. Cl.
*G01R 31/317* (2006.01)
*G01R 31/12* (2020.01)
*G01R 31/319* (2006.01)
*G06K 9/00* (2006.01)

(52) U.S. Cl.
CPC ....... *G01R 31/31704* (2013.01); *G01R 31/12* (2013.01); *G01R 31/319* (2013.01); *G06K 9/00013* (2013.01); *G06K 9/00087* (2013.01)

(58) Field of Classification Search
CPC .............. G01R 31/31704; G01R 31/12; G01R 31/319; G06K 9/00013; G06K 9/00087
See application file for complete search history.

(56) References Cited

U.S. PATENT DOCUMENTS

| | | | | |
|---|---|---|---|---|
| 4,649,374 A * | 3/1987 | Hoigaard | ............... | G01R 31/54 340/573.1 |
| 5,991,145 A * | 11/1999 | Lagrotta | ................... | H05F 3/02 361/212 |
| 2004/0021786 A1* | 2/2004 | Nakamura | ......... | G06K 9/00053 348/294 |
| 2004/0222802 A1* | 11/2004 | Chou | ................. | G06K 9/00053 324/661 |
| 2005/0231213 A1* | 10/2005 | Chou | ................. | G06K 9/00053 324/662 |
| 2006/0043882 A1* | 3/2006 | Shi | ...................... | H01L 51/5253 313/504 |
| 2006/0120573 A1* | 6/2006 | Iori | ........................ | G06K 9/036 382/124 |
| 2008/0158766 A1* | 7/2008 | Oyama | ................ | H05K 1/0259 361/220 |
| 2008/0267457 A1* | 10/2008 | Ali | ..................... | G06K 9/00053 382/115 |
| 2010/0065637 A1* | 3/2010 | Top | ....................... | G07F 7/0833 235/438 |
| 2013/0289901 A1* | 10/2013 | Samreth | ................. | G01R 1/025 702/58 |

OTHER PUBLICATIONS

B. D. Waghchaure and B. D. Jadhav, "Electrostatic discharge protected user interface," 2017 7th International Conference on Power Systems (ICPS), Pune, 2017, pp. 698-701. (Year: 2017).*

* cited by examiner

*Primary Examiner* — Kyle Vallecillo
(74) *Attorney, Agent, or Firm* — Sheridan Ross P.C.

(57) ABSTRACT

The present disclosure relates generally to biometric identification and electrostatic discharge (ESD) test verification system. Embodiments of the present disclosure provide systems and methods that combine ESD testing and biometric identification technology at a work area, such as a manufacturing workstation, to ensure that an employee is uniquely identified, and that the employee's electrical grounding straps are present and functioning correctly. Based on a result of the ESD testing and a biometric identification used to login at an ESD controlled work area, access to one or more functions of the manufacturing workstation may be granted, denied, or otherwise restricted.

20 Claims, 4 Drawing Sheets

ELECTROSTATIC DISCHARGE VERIFICATION DURING BIOMETRIC SCAN FOR TERMINAL LOGIN

BACKGROUND

The present disclosure is generally directed to access control systems and, in particular, toward biometric identification and electrostatic discharge (ESD) test verification systems.

Differences of electrical potential between an individual and electronics at a manufacturing workstation, or within a manufacturing facility, can result in a sudden discharge of static electricity, known as an ESD event, that is capable of damaging sensitive equipment. At times, this damage may not be readily detectable and may manifest in the form of a shortened product life, abnormal product behavior, or an unreliable product. To prevent ESD events from occurring during manufacture, individuals may be electrically grounded relative to a manufacturing workstation and the electronics being assembled.

BRIEF SUMMARY

In certain embodiments, the present disclosure relates to a system, device, and method that provides an ESD test verification and individual identification authorization during login to a manufacturing workstation. In some embodiments, an ESD and biometric identification verification system is provided, comprising: a biometric feature scanning device; an ESD grounding test device coupled to the biometric feature scanning device; a processor coupled to the biometric feature scanning device and the ESD grounding test device; and a memory coupled with and readable by the processor and storing therein instructions that, when executed by the processor, cause the processor to: initiate, via the biometric feature scanning device, a biometric scan of an object within a scanning zone of the biometric feature scanning device; determine, based on the biometric scan, biometric information for the object; initiate, via the ESD grounding test device, an electrical ground-path test for the object while the object is within the scanning zone of the biometric feature scanning device; and determine to grant operational access to a manufacturing workstation in response to a result of the electrical ground-path test indicating the object is electrically-grounded relative to the manufacturing workstation.

In some embodiments, a method for verifying an ESD state and biometric identification (ID) for an individual is provided, comprising: initiating, via a biometric feature scanning device of a manufacturing workstation, a biometric scan of the individual within a scanning zone of the biometric feature scanning device; determining, by a processor and based on the biometric scan, a biometric ID for the individual; initiating, via an ESD grounding test device of the manufacturing workstation, an electrical ground-path test for the individual while the individual is within the scanning zone of the biometric feature scanning device; and determining, by the processor, to grant access to a function of the manufacturing workstation when a result of the electrical ground-path test indicates the individual is electrically-grounded relative to the manufacturing workstation and the biometric ID for the individual matches an authorized record for the individual.

In some embodiments, a manufacturing apparatus is provided, comprising: a contact-based biometric feature scanning device that scans a fingerprint of an individual for identification information; an ESD grounding test device coupled to the contact-based biometric feature scanning device that initiates an electrical ground-path test for the individual in response to the individual contacting the contact-based biometric feature scanning device; and a processor coupled to the contact-based biometric feature scanning device and the ESD grounding test device that controls an operation of the manufacturing apparatus based on the identification information and a result of the electrical ground-path test.

Additional features and advantages are described herein and will be apparent from the following Description and the figures.

DETAILED DESCRIPTION

Figure 1:
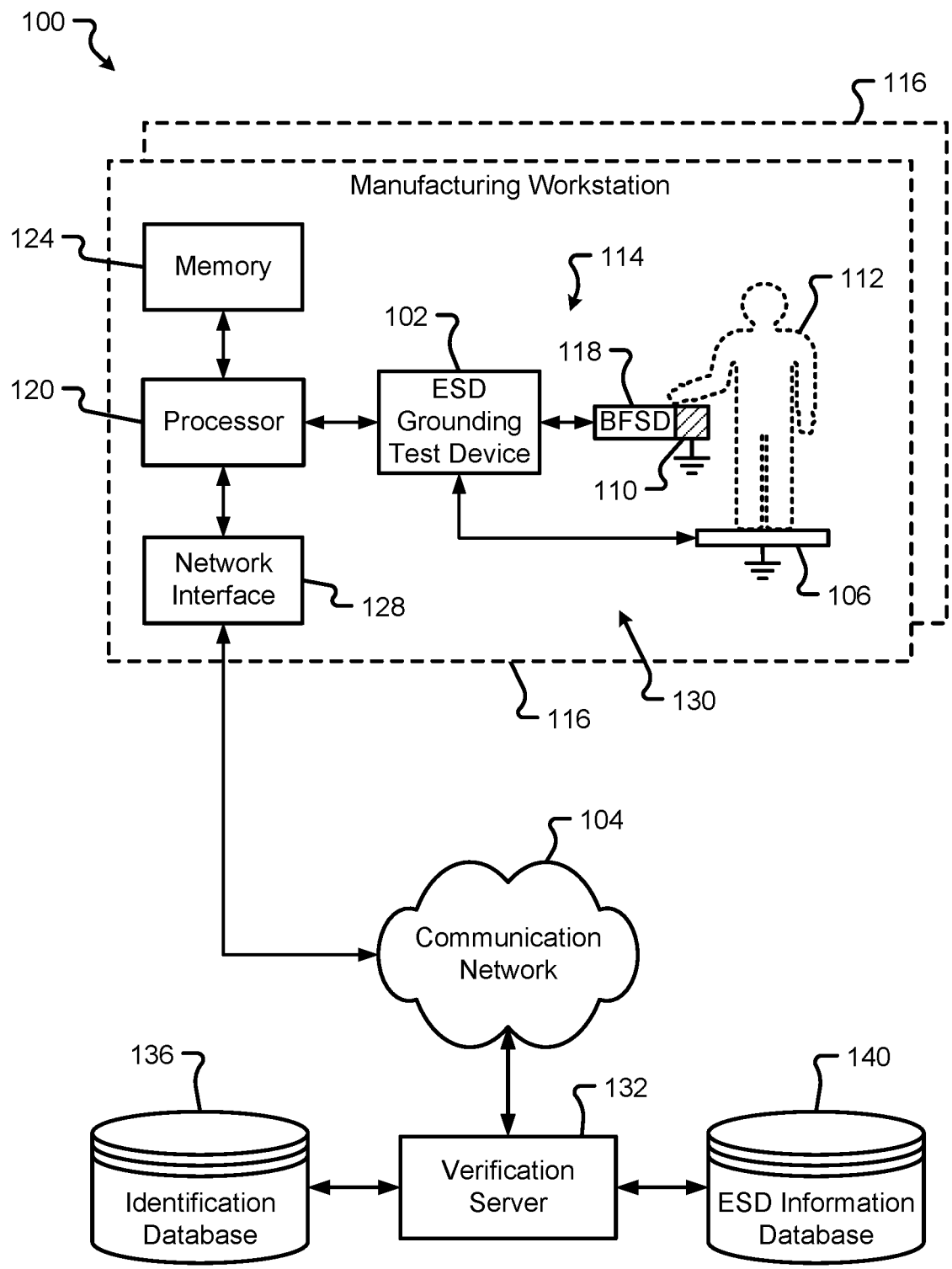
FIG. 1 is a block diagram of an ESD verification and biometric identification system in accordance with embodiments of the present disclosure.

Embodiments of the present disclosure will be described in connection with an ESD and biometric identification verification system. While certain embodiments of the present disclosure will reference the use of a manufacturing workstation, or apparatus, it should be appreciated that embodiments of the present disclosure are not so limited. For instance, the ESD and biometric identification methods and systems described herein may be employed at any manufacturing facility, storage area, test facility, or other ESD controlled area.

Factory line employees in a manufacturing facility are generally required to test the integrity of their ESD grounding straps (e.g., wrist straps, foot straps, heel straps, etc.) before performing assembly work. Employees typically test the integrity of their ESD grounding straps using an ESD test station remotely located from their work area on the line. However, conventional workstations (e.g., an employee's physical work area) have no process for ensuring the employee actually complied with ESD testing requirements or that the ESD test results were still valid between the time and location of the remote test and the time and location that the employee logged into their workstation and ESD controlled work area. Further, the ESD functionality of conventional workstations is checked only during infrequent audits. Another problem is associated with the integrity of an employee's login at a conventional workstation, which may only require an ID number for the employee to be entered via a terminal of the workstation. In the conventional workstation, there is no check or ability to ensure that employees use the correct ID number assigned to them.

Embodiments of the present disclosure provide systems and methods that combine ESD testing and biometric (e.g., fingerprint, etc.) ID technology at a work area (e.g., a manufacturing workstation, etc.) to ensure that an employee is uniquely identified, the employee's ground straps (e.g., wrist straps, foot straps, etc.) are present and functioning correctly, and that the ESD mats, or pads, are functioning correctly. Based on a result of the ESD testing and a biometric ID used to login at an ESD controlled work area, access to one or more functions of the workstation may be granted, denied, or otherwise restricted. For instance, if the biometric ID used for login and the ESD testing fails, the employee may be electronically "locked out" of the workstation until the issues associated with the biometric ID and ESD testing are resolved. In some embodiments, the methods and systems described herein may be employed in any manufacturing process where electronics and ESD controls are involved.

ESD protection conformance reduces the risks of electronic failure caused by ESD. ESD damaged boards (e.g., motherboards, printed circuit boards, etc.) may be especially troublesome because the ESD damage not only affects the material cost associated with rejected components, reworking, etc., but also negatively affects the customer experience, trust, and confidence. Many latent failures of electronics after installation can be traced back to ESD damage that occurred before the electronics were shipped. At least some of the benefits of the systems and methods described herein include, but are in no way limited to, establishing an unambiguous process to ensure employees are compliant with ESD requirements at their workstation (removing human error and circumvention), establishing real-time monitoring of the ESD control integrity of each workstation, and reducing ESD related quality issues by improving ESD compliance of the employee and the workstation.

With reference initially to FIG. 1, details of an ESD verification and biometric identification system 100 will be described in accordance with at least some embodiments of the present disclosure. The components of the ESD verification and biometric identification system 100, while depicted as having particular arrangements and devices, is not necessarily limited to the examples depicted herein. Rather, a system according to embodiments of the present disclosure may include one, some, or all of the components depicted in the system 100 and does not necessarily have to include all of the components in a single device.

The ESD verification and biometric identification system 100 is shown to include a communication network 104 that interconnects and facilitates machine-to-machine communications between one or multiple test stations 114, manufacturing workstations 116, verification servers 132, identification databases 136, and ESD information databases 140. It should be appreciated that the communication network 104 may correspond to one or many communication networks without departing from the scope of the present disclosure. In some embodiments, the manufacturing workstation 116 (including the test station 114), and the verification server 132 may be configured to communicate using various nodes or components of the communication network 104. The communication network 104 may comprise any type of known communication medium or collection of communication media and may use any type of protocols to transport messages between endpoints. The communication network 104 may include wired and/or wireless communication technologies. The Internet is an example of the communication network 104 that constitutes an Internet Protocol (IP) network consisting of many computers, computing networks, and other communication devices located all over the world, which are connected through many telephone systems and other means. Other examples of the communication network 104 include, without limitation, a standard Plain Old Telephone System (POTS), an Integrated Services Digital Network (ISDN), the Public Switched Telephone Network (PSTN), a Local Area Network (LAN), a Wide Area Network (WAN), a cellular network, and any other type of packet-switched or circuit-switched network known in the art. In addition, it can be appreciated that the communication network 104 need not be limited to any one network type, and instead may be comprised of a number of different networks and/or network types. Moreover, the communication network 104 may comprise a number of different communication media such as coaxial cable, copper cable/wire, fiber-optic cable, antennas for transmitting/receiving wireless messages, and combinations thereof.

The test station 114 may comprise an ESD grounding test device 102 that measures an electrical ground path between an object or individual under test and an electrical ground associated with the ESD grounding test device 102. The test station 114 may be part of a manufacturing workstation 116 or other ESD controlled work area 130.

The ESD grounding test devices 102 described herein may perform an electrical ground-path test to determine whether an object is grounded relative to a known electrical ground. In particular, the ESD grounding test devices 102 may measure an impedance between an object that is simultaneously contacting an electrically-grounded pad 106 (e.g., a pad comprising a conductive material that is connected to an electrical ground, etc.) and an ESD test pad 110 (e.g., a contact pad, button, or other electrically-grounded conductive material). For example, the electrically-grounded pad 106 may correspond to an ESD controlled mat (e.g., a floor mat, table mat, or other work surface etc.), the object may correspond to an individual 112, and the ESD test pad 110 may correspond to an electrically-grounded conductive touch pad or button such as an electrical ground-path test contact pad. Upon simultaneously contacting the electrically-grounded pad 106 at a first contact point and the ESD test pad 110 at a second contact point (both of which are electrically-grounded relative to the ESD grounding test device 102), an impedance of the object (e.g., the individual 112, etc.) can be measured by the ESD grounding test device 102.

The individual 112 in the previous example may be grounded to the electrically-grounded pad 106 via a conductive path running from the individual 112 to the electrically-grounded pad 106 via an electrically-conductive ground strap such as a wrist strap or a foot strap. An individual 112 is sufficiently grounded when a conductive ground path exists between the electrically-grounded pad 106 and the ESD test pad 110. In one embodiment, the impedance measured by the ESD grounding test device 102 may be less than approximately 35 megaohms for an individual 112 to pass the electrical ground-path test and be determined as grounded.

Results of the electrical ground-path tests performed by the ESD grounding test device 102 may be communicated, by way of the communication network 104, to the verification server 132 and/or a manufacturing workstation 116 in the ESD verification and biometric identification system 100.

The manufacturing workstation 116 may correspond to a physical station, or work area, associated with a manufacturing line, production line, assembly line, or test facility. The manufacturing workstation 116 may be part of a manual, semi-automated, or fully-automated assembly line. In any event, the manufacturing workstation 116 comprises an ESD controlled work area 130 including an ESD grounding test device 102, an electrically-grounded pad 106, and a biometric feature scanning device 118. In some embodiments, the biometric feature scanning device 118 of the manufacturing workstation 116 may include a portion of the ESD grounding test device 102 and/or an ESD test pad 110. In one embodiment, the ESD test pad 110 may be in contact with a portion of the biometric feature scanning device 118 such that a person cannot be scanned for an individual ID without contacting the ESD test pad 110.

Among other benefits, incorporating the functionality of the biometric feature scanning device 118 and the ESD grounding test device 102 at the manufacturing workstation 116 requires an individual ID and electrical ground-path verification test to be performed, and passed, before the individual 112 is allowed access to a functionality of the manufacturing workstation 116. This approach can lockout unauthorized individuals, those individuals who have failed to pass the electrical ground-path test, and even prevent circumvention of the system. For instance, by performing the electrical ground-path test verification and ID authorization while a specific individual 112 is in simultaneous contact with the ESD test pad 110 and biometric feature scanning device 118, one individual cannot simply pass the electrical ground-path test while a separate individual passes the ID authorization to gain access to the manufacturing workstation 116.

The biometric feature scanning device 118 may correspond to a type of device that scans biometric features of an individual within a scanning zone of the biometric feature scanning device 118. In one embodiment, the biometric features may include an individual's fingerprint features such as loops, whorls, arches, ridges, valleys, etc. In some embodiments, the biometric features may include an individual's facial features (e.g. the eyes, nose, mouth, ears, chin, etc.), temperature signature (e.g., body heat pattern, temperature profile, etc.), eye features (e.g., iris, retinal, or other information), voice features (e.g., speaker recognition, tone, voice biometrics, etc.) and/or other biometric features associated with a human. In some embodiments, the biometric feature scanning device 118 may be configured to detect one or more of the biometric features (e.g., facial, fingerprint, iris/retinal, etc.) associated with a human. Examples of biometric feature scanning devices 118 may include, but are in no way limited to, a facial recognition system, a fingerprint scanner/reader, an iris scanning system, a voice recognition system, and/or combinations thereof.

In addition to detecting a biometric feature of an individual 112, the biometric feature scanning device 118 may record biometric information of the features corresponding to, for example, the type, size, area, relationship, distances, and/or aspect ratio of one or more of the individual's 112 biometric features. This information may be saved in a memory location of a database 136 in lieu of an image of the biometric feature itself. It is an aspect of the present disclosure that one or more biometric feature scanning devices 118 may be attached to, or incorporated in, a manufacturing workstation 116. Additional details of the biometric feature scanning device 118 are at least described in conjunction with FIG. 2.

In some embodiments, the manufacturing workstation 116 may include a processor 120, a memory 124, at least one network interface 128, display devices (e.g., monitors, etc.), and/or other user interface devices (e.g., keyboards, touchpads, touchscreens, etc.). Although not shown, the display devices and/or user interface devices may be operatively connected to the processor 120 and memory 124. The display devices may include one or more display screens that are configured to selectively activate pixels and/or display elements to render one or more windows, indicators, interactive elements, icons, characters, lights, images, etc. Examples of the display screen may include, but are in no way limited to, a liquid crystal display (LCD), a light-emitting diode (LED) display, an electroluminescent display (ELD), an organic LED (OLED) display, and/or some other two-dimensional and/or three-dimensional display. The display devices may render, or otherwise display, information corresponding to a functionality of the manufacturing workstation 116, a result of the electrical ground-path test performed by the ESD grounding test device 102, and/or a result of a biometric ID scan performed by the biometric feature scanning device 118. The user interface may correspond to any type of input and/or output device that enables an individual 112 to interact with the manufacturing workstation 116. As can be appreciated, the nature of the user interface may depend upon the nature of the manufacturing workstation 116. For example, if the manufacturing workstation 116 is a digital device, then the user interface may include one or more touch-sensitive displays, LED/LCD display screens, etc.

The ESD verification and biometric identification system 100 may comprise multiple manufacturing workstations 116. The manufacturing workstations 116 may utilize the same or different types of communication protocols to connect with the communication network 104. It should also be appreciated that the manufacturing workstations 116 may or may not provide the same type of manufacturing tools, aids, or functions to an individual 112. For instance, one manufacturing workstation 116 may correspond to an electrical component assembly station (e.g., including various assembly tools, fasteners, electrical components, etc.), another manufacturing workstation 116 may correspond to a soldering station (e.g., including a soldering iron, solder, flux, etc.), another manufacturing workstation 116 may correspond to an inspection station (e.g., including electrical test equipment, digital readouts, etc.), and another manufacturing workstation 116 may correspond to any other workstation having an ESD controlled work area 130.

It may be possible for the some of the manufacturing workstations 116 to communicate with one another via the communication network 104. In some embodiments, one or more of the manufacturing workstations 116 may only be configured to communicate with a centralized management server and/or the verification server 132. Although not depicted, the system 100 may include a separate server or collection of servers that are responsible for managing the operation of the various manufacturing workstations 116 in the ESD verification and biometric identification system 100. It should also be appreciated that the verification server 132 may or may not be co-located with one or more manufacturing workstations 116 in the same property or premises. Thus, one or more manufacturing workstations 116 may communicate with the verification server 132 over a WAN, such as the Internet. In such an event, a tunneling protocol or Virtual Private Network (VPN) may be established over some of the communication network 104 to ensure that communications between a manufacturing workstation 116 and a remotely-located verification server 132 are secured.

The manufacturing workstation 116 is further shown to include a processor 120, memory 124, and a network interface 128. These resources may enable functionality of the manufacturing workstation 116 as will be described herein. For instance, the network interface 128 provides the manufacturing workstation 116 with the ability to send and receive communication packets or the like over the communication network 104. The network interface 128 may be provided as a network interface card (NIC), a network port, drivers for the same, and the like. Communications between the components of the manufacturing workstation 116 and other devices connected to the communication network 104 may all flow through the network interface 128.

The processor 120 may correspond to one or many computer processing devices. For instance, the processor 120 may be provided as silicon, as a Field Programmable Gate Array (FPGA), an Application-Specific Integrated Circuit (ASIC), any other type of Integrated Circuit (IC) chip, a collection of IC chips, or the like. As a more specific example, the processor 120 may be provided as a microprocessor, Central Processing Unit (CPU), or plurality of microprocessors that are configured to execute the instructions sets stored in memory 124. Upon executing the instruction sets stored in memory 124, the processor 120 enables various ESD test functions, biometric ID functions, authentication, and access control functions of the manufacturing workstation 116.

The memory 124 may include any type of computer memory device or collection of computer memory devices. Non-limiting examples of memory 124 include Random Access Memory (RAM), Read Only Memory (ROM), flash memory, Electronically-Erasable Programmable ROM (EEPROM), Dynamic RAM (DRAM), etc. The memory 124 may be configured to store instruction sets in addition to temporarily storing data for the processor 120 to execute various types of routines or functions. Although not depicted, the memory 124 may include instructions that enable the processor 120 to store data in an identification database 136 and/or an ESD information database 140 and retrieve information from the databases 136, 140. Additionally or alternatively, the identification database 136 or data stored therein may be stored internal to the manufacturing workstation 116 (e.g., within the memory 124 of the manufacturing workstation 116 rather than in a separate database) or the verification server 132. Additionally or alternatively, the ESD information database 140 or data stored therein may be stored internal to the manufacturing workstation 116 or the verification server 132.

The ESD verification and biometric identification system 100 may comprise a verification server 132 that determines whether a biometric ID for an individual 112 matches an authorized record for the individual 112 and whether the individual 112 is grounded based on a result of the electrical ground-path test performed by the ESD grounding test device 102 of the manufacturing workstation 116. Similar to the manufacturing workstation 116, the verification server 132 may comprise a processor 120, memory 124, and a network interface 128, as described above. In some embodiments, the memory 124 of the verification server 132 may comprise different instructions than the memory 124 of the manufacturing workstation 116. Upon receiving biometric information obtained from a biometric ID scan (e.g., performed by the biometric feature scanning device 118), the verification server 132 may access the identification database 136 for a matching record and authorization. The verification server 132 may access the ESD information database 140 for acceptable impedance levels associated with the manufacturing workstation 116. In some embodiments, the verification server 132 may record an impedance of an individual 112 (e.g., measured at an ESD grounding test device 102) in the ESD information database 140.

Figure 2:
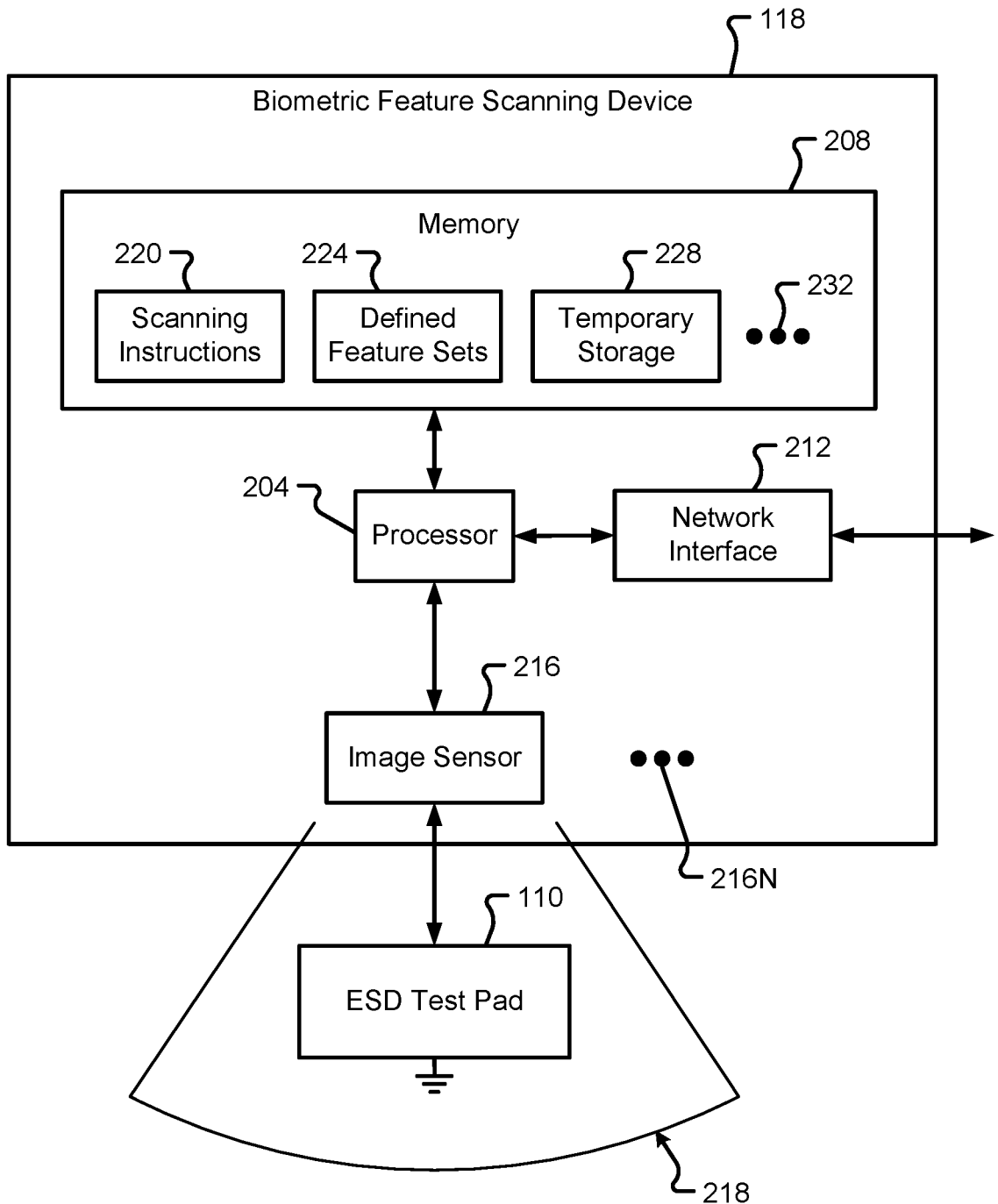
FIG. 2 is a block diagram depicting an illustrative biometric feature scanning device in accordance with embodiments of the present disclosure.

FIG. 2 is a block diagram depicting an illustrative biometric feature scanning device 118 in accordance with at least some embodiments of the present disclosure. The biometric feature scanning device 118 may include a processor 204, a memory 208, a network interface 212, and one or multiple image sensors 216 or other scanning devices 216N. In some embodiments, the processor 204 may be similar or identical to the processor 120. For example, the processor 204 may correspond to one or many microprocessors, CPUs, microcontrollers, or the like. The processor 204 may be configured to execute one or more instruction sets or rules 232 stored in memory 208.

The network interface 212 may also be similar or identical to network interface 128. The nature of the network interface 212, however, may depend upon whether the network interface 212 is provided in a manufacturing workstation 116, a mobile user device, or some other machine that interfaces with one or more devices in the ESD verification and biometric identification system 100. Examples of a suitable network interface 212 include, without limitation, an Ethernet port, a USB port, an RS-232 port, an RS-485 port, a NIC, an antenna, a driver circuit, a modulator/demodulator, etc. The network interface 212 may include one or multiple different network interfaces depending upon whether the biometric feature scanning device 118 is connecting to a single communication network 104 or multiple different types of communication networks 104. For instance, the biometric feature scanning device 118 may be provided with both a wired network interface and a wireless network interface without departing from the scope of the present disclosure.

The image sensor 216 and other scanning devices 216N may include any device configured to detect a biometric feature of an individual within a scanning zone 218. The scanning zone 218 may correspond to a reading or detection distance from the image sensor 216 or other scanning devices 216. Additionally or alternatively, the scanning zone 218 may correspond to a physical contact area of the image sensor or other scanning devices 216. Although the biometric feature scanning device 118 may only require one image sensor 216 or other scanning device 216N to obtain biometric information about an individual and retrieve an authorized ID, embodiments of the present disclosure anticipate that the biometric feature scanning device 118 can include multiple image sensors 216 or scanning devices 216N. The other scanning devices 216N may include, but are in no way limited to, one or more iris scanners, retinal scanners, and/or combinations thereof.

The image sensor 216 may comprise an optical scanner system or a capacitive scanning sensor configured to detect and measure distances between features of a human finger or hand print (e.g., a fingerprint reader, etc.) The image sensor 216 may detect and read an individual's 112 fingerprint image at the ESD test pad 110. The image sensor 216 may determine a number of biometric features associated with a print, such as a number, size, and location of valleys, ridges, bifurcations, minutiae, and/or other features. This biometric information may be used to characterize a pattern for a print that may uniquely identify an individual 112. The data obtained from the image sensor 216 may be stored as numbers in a biometric feature template. The template may comprise discrete memory locations for specific biometric information in the pattern (e.g., measurements of and/or between recognized biometric features, etc.). This template may be stored and associated with an individual ID to differentiate between individuals 112, such as authorized and unauthorized individuals, in the ESD verification and biometric identification system 100.

In some embodiments, the image sensor 216, or a portion thereof, may include an ESD test pad 110. The ESD test pad 110 may comprise a conductive material (e.g., in the form of a contact pad, button, strip of material, etc.) that is electrically-grounded relative to the ESD grounding test device 102 and the ESD controlled work area 130 of the manufacturing workstation 116. As illustrated in FIG. 2, the ESD test pad 110 may be disposed at least partially within the scanning zone 218 of the image sensor 216. This arrangement allows the electrical ground-path test to be performed (by the ESD grounding test device 102) on the individual 112 while the individual 112 is being scanned by the image sensor 216 for biometric information. This arrangement of the ESD test pad 110 at least partially within the scanning zone 218 of the image sensor 216 can prevent access circumvention attempts to perform an ID authorization of a first individual and an electrical ground-path test of a different second individual.

The ESD test pad 110 may be arranged completely within the scanning zone 218 or arranged in a position that disposes only a portion of the conductive material of the ESD test pad 110 in the scanning zone 218. For instance, the ESD test pad 110 may be arranged directly adjacent to, or in contact with, the image sensor 216, where a portion of the ESD test pad 110 overlaps, or is overlapped by, a portion of the scanning zone 218.

As provided above, the other scanning devices 216N may include image sensors and/or an iris/retinal scanner. The image sensors may include one or more cameras that are capable of obtaining image data of subject individual 112. In one embodiment, the image sensors may obtain two-dimensional or three-dimensional data for an individual 112 within the scanning zone 218. Two-dimensional data may be detected by at least one image sensor and used by the processor 204 to map a number of biometric features, sizes of biometric features, and/or distances between biometric features for an individual, in two dimensions (e.g., along an X-axis and along a Y-axis, orthogonal to the X-axis, etc.). In addition to the two-dimensional data, three-dimensional data may be detected by at least two image sensors and used by the processor 204 to determine a depth or range distance of various biometric features, or parts of biometric features, for the individual (e.g., along a Z-axis that extends along an axis that is perpendicular to a plane defined by the X-axis and the Y-axis, such as the XY-plane). In any event, the data obtained from the one or many image sensors may be stored as numbers in a biometric feature template. The template may comprise dedicated memory locations for specific biometric information (e.g., measurements of and/or between recognized biometric features, etc.). This template may be stored with an individual ID in the identification database 136. The biometric information in the template may characterize an identity of an individual 112. This identity may be used to differentiate between individuals 112 in the ESD verification and biometric identification system 100.

The iris/retinal scanner may comprise an image sensor, light, and/or laser configured to measure features of a person's eye. In one embodiment, the iris/retinal scanner may obtain pattern information from blood vessels on the retina of the eye. In some embodiments, the iris/retinal scanner may obtain images of the iris of a person's eye via at least one infrared or other image sensor. The images may define pattern information about features of the iris including, but in no way limited to, color, shape, location, of portions of the iris. Similar to the data obtained by the image sensors, the data obtained from the iris/retinal scanner may be stored as numbers in a biometric feature template. The template may comprise dedicated memory locations for specific biometric information (e.g., measurements of and/or between recognized biometric features, etc.). This template may be similarly stored and associated with an individual ID to differentiate between individuals 112 in the ESD verification and biometric identification system 100.

Activities of the biometric feature scanning device 118 related to obtaining biometric information from an individual 112 in a scanning zone 218 of the image sensor 216 or the other scanning devices 216N may be managed and reported by the scanning instruction set 220. In one embodiment, when an individual 112 is present within a scanning zone 218 of the image sensor 216, the scanning instructions 220 may initiate a scan of the individual 112 for biometric information. Other scanning triggers may include continually scanning, periodic scanning, or condition-based scanning. Condition-based scanning may initiate a scan of an individual 112 upon attempting to access a particular functionality of the manufacturing workstation 116 or upon expiration of an authorization timer. In any event, the biometric information may be obtained by the scanning instruction set 220 and reported to the verification server 132. It is an aspect of the present disclosure that the scanning instruction set 220 may update records stored in the identification database 136, the ESD information database 140, and/or other memory devices in the ESD verification and biometric identification system 100.

The memory 208 may be similar or identical to memory 124. For instance, the memory 208 may include one or multiple computer memory devices that are volatile or non-volatile. The memory 208 may be configured to store instruction sets that enable scanning of individuals within the scanning zone of the biometric feature scanning device 118, feature definition templates, temporary storage data, or other rules 232. Once example of an instruction set that may be stored in the memory 208 may include a scanning instruction set 220. Additionally or alternatively, the memory 208 may include a number of defined feature sets 224 for particular biometric features that are scanned by the image sensor 216 or other scanning devices 216N. These defined feature sets 224 may include groups of features, patterns, shapes, and relationships between biometric features for fingerprint reading via a image sensor 216, facial recognition via image sensors, and eye scanning via an iris/retinal scanner. The feature sets may include recognition patterns, established shapes, nomenclature, or memory storage locations in a template to follow when obtaining biometric information from an individual 112.

A temporary storage location 228 in the memory 208 may be used to temporarily store image information or a data set associated with the biometric features of an individual 112 while the processor 204, in conjunction with the scanning instructions 220, determines biometric information representing measurements and/or other characteristics of the biometric features. This temporary storage location 228 may be deleted and/or overwritten when the biometric information is obtained from the image sensor 216. In some embodiments, the biometric information obtained from an individual 112 may be stored in one or more memory locations in the memory 208 of the biometric feature scanning device 118.

Figure 3A:
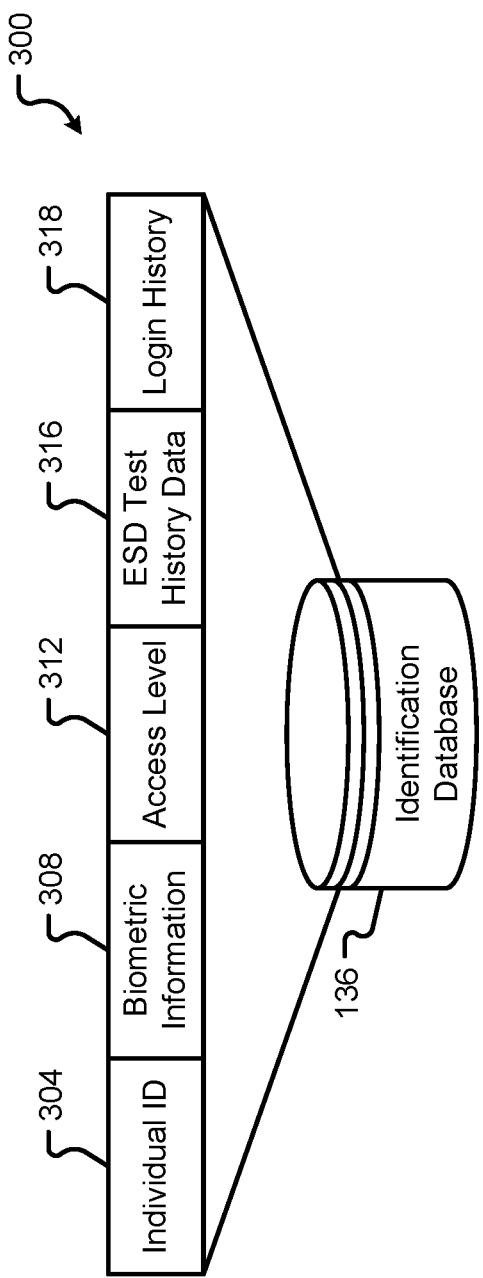
FIG. 3A is a block diagram depicting a first illustrative data structure used in accordance with embodiments of the present disclosure.
Figure 3B:
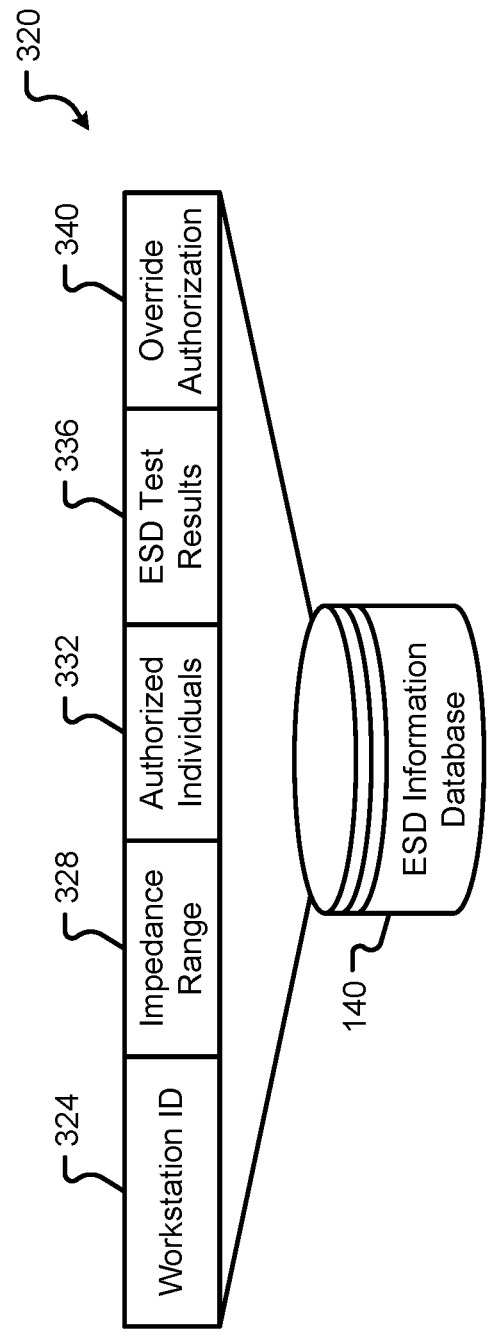
FIG. 3B is a block diagram depicting a second illustrative data structure used in accordance with embodiments of the present disclosure.

With reference now to FIGS. 3A and 3B, additional details of data structures that are useable in connection with determining whether to grant access to an operational functionality of a manufacturing workstation 116 will be described in accordance with at least some embodiments of the present disclosure. It should be appreciated that the data structures depicted and described herein may be stored within a central database or may be distributed among a number of data storage nodes. Additionally or alternatively, some or all of the fields of the data structures may be maintained in devices of the ESD verification and biometric identification system 100 such as the manufacturing workstation 116, the verification server 132, and/or some other device without departing from the scope of the present disclosure.

With reference initially to FIG. 3A, details of a data structure 300 that may be maintained as part of an identification database 136 will be described in accordance with at least some embodiments of the present disclosure. The database 136 may be configured to store one or multiple data structures 300 that are used in connection with determining an ID for an individual 112 and login history. As a non-limiting example, the data structure 300 may be used to store biometric information, authorization or access levels, individual ESD test history, workstation login history, times associated therewith, and the like. Even more specifically, the data structure 300 may include a plurality of data fields that include, for instance, an individual ID field 304, a biometric information field 308, an access level field 312, an ESD test history data field 316, and a login history data field 318.

The individual ID field 304 may be used to store any type of information that identifies an individual 112. In some embodiments, the individual ID field 304 may store one or more of username information for an individual 112, a real name for an individual 112, password information for an individual 112, a unique ID for an individual 112, and any other type of data that can be used to differentiate between and uniquely identify individuals 112 in an ESD verification and biometric identification system 100. In some embodiments, the individual ID field 304 may store an identification character (e.g., number, letter, and/or symbol) and/or a string of characters that uniquely identify one individual 112 from another in the database 136. In some embodiments, the data stored in the individual ID field 304 may be randomly generated, pseudo-randomly generated, or sequentially generated based on when an account for an individual 112 is created in the verification server 132 (e.g., after a first scan of the individual 112 for biometric information, etc.). Each individual 112 can have a unique memory location, and individual ID in the database 136, for storing information about the individual 112. In some embodiments, the individual ID stored in the individual ID field 304 may be automatically assigned to the individual 112, for example, without input from the individual 112.

The biometric information field 308 may be used to store information about certain biometric features of an individual 112. The biometric information field 308 may include an image of the individual 112 (e.g., photograph, video, etc.), or an image of a part of the individual 112 (e.g., fingerprint, iris, retina, etc.). In some embodiments, the biometric information field 308 may include information about a type, size, relationship, pattern, aspect, and/or ratio of an individual's biometric features. For instance, an individual's 112 fingerprint biometric information may be stored as a set of numbers defining the measurement of a shape, number, and position of various loops, arches, whorls, etc., that are associated with the fingerprints of an individual 112. The set of numbers may be stored in a template where each measurement is stored in order. As can be appreciated, this information may be used to identify one individual 112 from another in the database 136. In some embodiments, the biometric information may be linked to a name, address, contact information, or other identity information for the individual 112. In one embodiment, the data in the biometric information field 308 may be obtained by a biometric feature scanning device 118 scanning an individual 112 for a first time, for example, upon account creation.

The access level field 312 may be used to store an authorization, or access level, for the individual 112 identified in the individual ID field 304. The access level field 312 may include data that defines whether an individual 112 is authorized to access a particular manufacturing workstation 116 or an operational functionality associated with a particular manufacturing workstation 116. In some embodiments, the access level field 312 may include a list or identification of manufacturing workstations 116 that the individual 112 has access to and/or is restricted from. In one embodiment, the access level field 312 may define a type of access available to the individual 112. For example, a first individual may have a "gold" level of access, which allows the first individual access to all manufacturing workstations 116 associated with the "gold" level. Continuing this example, a second individual may have a "platinum" level of access, which may allow the second individual to access all manufacturing workstations 116 associated with the "platinum" and the "gold" levels of access. However, in this example, the first individual may be restricted from accessing a "platinum" level manufacturing workstation 116.

Additionally or alternatively, the access level field 312 may be used to store data that authorizes an individual 112 to override access to a particular manufacturing workstation 116 or an operational functionality associated with a particular manufacturing workstation 116 for another individual. In some embodiments, a manufacturing workstation 116 may be known to have a faulty biometric feature scanning device 118, ESD grounding test device 102, or associated equipment (e.g., ESD test pad 110, the electrically-grounded pad 106, etc.). In this example, a supervisor having override access may allow an individual 112 to access the functionality of the manufacturing workstation 116 by overriding a restriction based on a failed ID match and/or a failed electrical ground-path test for the individual 112.

The ESD test history data field 316 may be used to store historical data associated with electrical ground-path tests for the individual 112. In particular, the ESD test history data field 316 may store results associated with each electrical ground-path test performed by an ESD grounding test device 102 over time. Each test result stored in the ESD test history data field 316, whether pass or fail, may identify an impedance measured by the ESD grounding test device 102, an ID of the manufacturing workstation 116 where the test was performed, and a timestamp associated with each test performed. In some embodiments, the ESD test history data field 316 may be used to store a timer value defining when a subsequent electrical ground-path test is required to be performed on the individual 112 at the manufacturing workstation 116. The value of the timer may count up, count down, or increment in any known way to track a passage of time. Upon expiration of the timer, the manufacturing workstation 116 may restrict, or otherwise limit, access to an operational functionality of the manufacturing workstation 116 for the individual 112 until a successful electrical ground-path test result and ID verification for the individual 112 is obtained by the biometric feature scanning device 118.

The login history data field 318 may be used to store data to track when and where an individual 112 has logged-in, or attempted to log-in, to a manufacturing workstation 116. Each time an individual 112 is scanned via the image sensor 216 and is tested by the ESD grounding test device 102 of a manufacturing workstation 116, an entry may be stored in the login history data field 318. The entry may identify the manufacturing workstation 116, a login result (e.g., whether attempted, failed, or successful), and a timestamp associated with the login result. Coupled with the information in the ESD test history data field 316, the information in the login history data field 318 can provide detailed information about manufacturing workstations 116 the individual 112 has used as well as whether the individual 112 passed or failed a particular test (e.g., electrical ground-path test, ID verification, etc.).

FIG. 3B shows details of another data structure 320 that may be used within the ESD verification and biometric identification system 100 in accordance with at least some embodiments of the present disclosure. In some embodiments, the ESD test data structure 320 may be stored in the ESD information database 140, the identification database 136, or an internal memory of the manufacturing workstation 116 and/or the verification server 132. In any event, the one or more data structures 320 may be used in connection with determining an acceptable electrical ground-path test range and historical results for a manufacturing workstation 116. In some embodiments, the data stored in the ESD test data structure 320 may be stored for a plurality of different manufacturing workstation 116. As a non-limiting example, the data structure 320 may be used to store acceptable test ranges, historical test results, authorization, and the like associated with a manufacturing workstation 116. Even more specifically, the data structure 320 may include a plurality of data fields that include, for instance, a workstation ID field 324, an impedance range data field 328, an authorized individuals data field 332, an ESD test results data field 336, and an override authorization data field 340. It should be appreciated that the data structure 320 may have greater or fewer fields than depicted in FIG. 3B.

The workstation ID field 324 may be used to store an identification of a manufacturing workstation 116 in the ESD verification and biometric identification system 100. In some embodiments, each manufacturing workstation 116 may include a device identifier (e.g., a hardware identification, MAC address, IP address, or other unique serial number) that uniquely identifies one manufacturing workstation 116 from another in the ESD verification and biometric identification system 100.

The impedance range data field 328 may be used to store an acceptable impedance range for the manufacturing workstation 116 identified in the workstation ID field 324. In some embodiments, a type of manufacturing workstation 116 may require a specific impedance range that is different from other manufacturing workstation 116 in the ESD verification and biometric identification system 100. The impedance range may be used to determine whether an individual 112 passes or fails an electrical ground-path test for a particular manufacturing workstation 116. In one embodiment, the impedance range may be defined in megaohms, or some other electrical characteristic. For example, an impedance range may correspond to a range of 0 to 35 megaohms. This impedance range may define that an electrical ground-path test performed on an individual 112 will pass when the result of the test is less than 35 megaohms and fail when the result of the test is greater than or equal to 35 megaohms.

The authorized individuals data field 332 may be used to store an authorization, or access level, for individuals 112 who are allowed to access an operational functionality of the manufacturing workstation 116 identified in the workstation ID field 324. The authorized individuals data field 332 may include data that defines whether a particular individual 112 is authorized to access the manufacturing workstation 116 or an operational functionality associated with a particular manufacturing workstation 116. In some embodiments, the authorized individuals data field 332 may include a list or identification of individuals 112 who have access to, or who are restricted from accessing, the manufacturing workstation 116. In some embodiments, the authorized individuals data field 332 may define a type of individual access for the manufacturing workstation 116. For example, the manufacturing workstation 116 may require a "gold" level of access for an individual 112, which allows any individual 112 having a "gold" level of access, or above, to access the manufacturing workstation 116. Continuing this example, an individual having a lower level of access (e.g., a "silver" level of access) would be restricted from accessing the manufacturing workstation 116.

The ESD test results data field 336 may be used to store historical data associated with electrical ground-path tests for the manufacturing workstation 116. In particular, the ESD test results data field 336 may store results associated with each electrical ground-path test performed by an ESD grounding test device 102 at the manufacturing workstation 116 over time. Each test result stored in the ESD test results data field 336, whether pass or fail, may identify an impedance measured by the ESD grounding test device 102, an ID of an individual 112 who was tested, and a timestamp associated with each test performed. In some embodiments, the ESD test results data field 336 may be used to store a timer value defining when a subsequent electrical ground-path test is required at the manufacturing workstation 116. The value of the timer may count up, count down, or increment in any known way to track a passage of time. Upon expiration of the timer, the manufacturing workstation 116 may restrict, or otherwise limit, access to an operational functionality of the manufacturing workstation 116 until a successful electrical ground-path test result and ID verification for an individual 112 is obtained by the biometric feature scanning device 118.

The override authorization data field 340 may be used to store data identifying an authorization, or access level, associated with an individual 112 for overriding a requirement of the manufacturing workstation 116. The override authorization data field 340 may store a type of access level associated with an individual 112 (e.g., stored in the access level field 312 of the data structure 300) required to override access to the manufacturing workstation 116 or an operational functionality associated with the manufacturing workstation 116.

Figure 4:
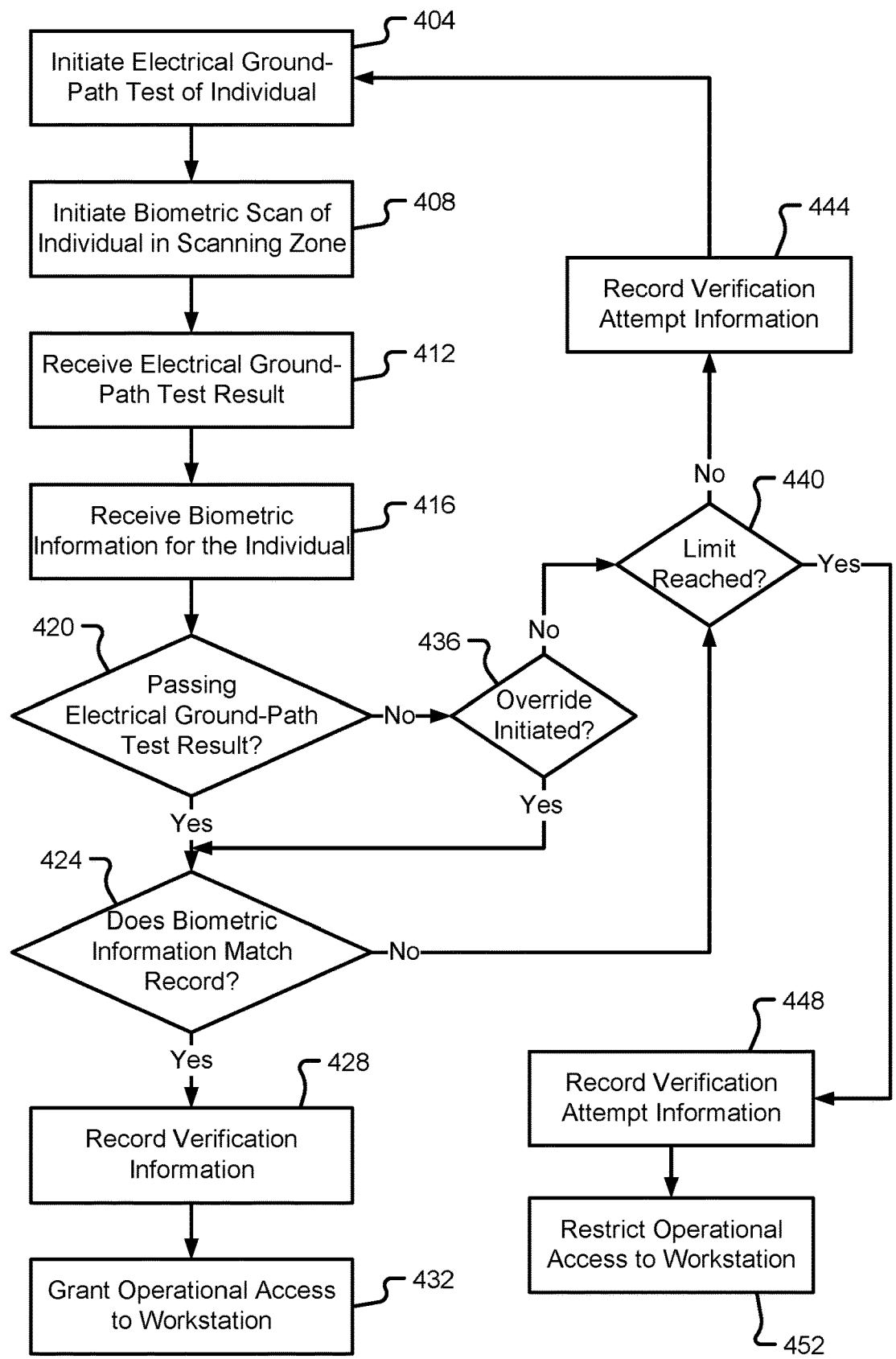
FIG. 4 is a flow diagram depicting a method of verifying an ESD state and biometric identification for an individual in accordance with embodiments of the present disclosure.

With reference now to FIG. 4, a flow diagram depicting a method of verifying an ESD state and biometric identification for an individual 112 is shown in accordance with embodiments of the present disclosure. The method begins by initiating an electrical ground-path test of an individual 112 (step 404). In some embodiments, the electrical ground-path test may be initiated when an individual 112 makes contact with the ESD test pad 110 of the biometric feature scanning device 118. In particular, the individual 112 may contact the ESD test pad 110 associated with a manufacturing workstation 116. For instance, contact by the individual 112 with the image sensor 216 comprising the ESD test pad 110 may close an electrical circuit between an electrical-ground associated with the individual 112 and an electrical-ground associated with the ESD grounding test device 102 of the manufacturing workstation 116. Upon closing the circuit, the electrical ground-path test may be initiated.

The method continues by initiating a biometric scan of the individual 112 in the scanning zone 218 of the image sensor 216 (step 408). In some embodiments, the biometric scan may be triggered by the initiation of the electrical ground-path test in step 404. Stated another way, the electrical ground-path test and the biometric scan of the individual 112 may be performed substantially simultaneously or at the same time. For example, the contact by the individual 112 with the image sensor 216 and/or the ESD test pad 110 may initiate the scan of the individual 112 for biometric information.

Next, the method may proceed by receiving an electrical ground-path test result from the ESD grounding test device 102 (step 412). In some embodiments, the ESD grounding test device 102 may refer to the ESD information database 140, via the communication network 104, for an acceptable impedance range (e.g., stored in the impedance range data field 328) for the manufacturing workstation 116. In one embodiment, the electrical ground-path test may determine an impedance, or resistance, between the individual 112 and an electrical-ground for the manufacturing workstation 116. If the impedance of the individual 112 falls within the impedance range, the individual 112 passes the electrical ground-path test.

The method may continue by receiving biometric information for the individual 112 (step 416). The biometric information may be obtained by scanning a fingerprint of the individual 112 via the image sensor 216. This information may be compared to information stored in an identification database 136 to determine an identity of the individual 112 scanned. Upon determining an identity of an individual 112, the information associated with the identified individual 112 stored in the identification database 136, for example, may be retrieved from the database 136.

In some embodiments, the method determines whether the electrical ground-path test result for the individual 112 passes or fails (step 420). As provided above, a passing result may correspond to an impedance for the individual 112, and measured by the ESD grounding test device 102, that falls within the acceptable impedance range for the manufacturing workstation 116. In one embodiment, the acceptable impedance range may be retrieved from the impedance range data field of the 328 ESD information database 140. For example, processor 120 of the manufacturing workstation 116 may access a memory device across the communication network 104 and retrieve from a memory location on the memory device (e.g., in the ESD information database) an impedance range that defines when the individual 112 is electrically-grounded relative to the manufacturing workstation 116. If the electrical ground-path test result for the individual 112 falls outside of the acceptable impedance range for the manufacturing workstation 116, the test result fails. A failing test result may result in locking the ESD test pad 110 out of accessing an operational function of the manufacturing workstation 116.

The method may continue depending on the result of the electrical ground-path test. For instance, if the individual 112 passes the electrical ground-path test, the method may continue by determining whether the biometric information obtained from the image sensor 216 matches an authorized record stored in memory (step 424). However, if the individual 112 fails the electrical ground-path test, the method may continue by determining whether an override of the test has been initiated (step 436).

Determining whether the biometric information obtained from the image sensor 216 matches an authorized record stored in memory may include the processor 120 of the manufacturing workstation 116 referring to data stored in the identification database 136. Specifically, the biometric information obtained from the image sensor 216 may be compared to the data stored in the biometric information field 308 of the data structure 300. In one embodiment, this data may be compared by the processor 120 or the verification server 132. If a match exists between the biometric information obtained and the information stored in the biometric information field 308, the manufacturing workstation 116 may determine that, based on the positive electrical ground-path test result and ID of the individual 112, the individual 112 is authorized to access an operational functionality of the manufacturing workstation 116.

In this example, the method may proceed to record the verification information (e.g., the positive, or the passing, electrical ground-path test result and authorized ID of the individual 112) in a memory of the ESD verification and biometric identification system 100 (step 428). In some embodiments, this information may be stored in the identification database 136 and/or the ESD information database 140. Further, the method may proceed by determining to grant operational access to the manufacturing workstation 116 for the individual 112 verified (step 432). Granting operational access may include unlocking the manufacturing workstation 116, providing access to a functionality of the manufacturing workstation 116, and/or otherwise allowing the manufacturing workstation 116 to operate.

In some cases, however, the individual 112 may not pass electrical ground-path test. In this instance, the method may determine whether an override has been initiated (step 436). The override may allow a supervisor, or other user, to override a requirement associated with the manufacturing workstation 116. This override may be initiated where the ESD equipment of a station 116 is known to be faulty or in need of maintenance. In one embodiment, the override may be initiated by an individual 112 having override authorization (e.g., stored in the override authorization data field 340) when the electrical ground-path test result is not critical to an operation of the manufacturing workstation 116. In any event, an override initiated by an authorized individual may allow the method to continue by determining whether the ID of the individual 112 at the manufacturing workstation 116 matches a stored authorized record.

The method may proceed by determining whether a number of failed electrical ground-path tests or ID verification attempts have been reached (step 440). For instance, due to inconsistencies associated with ESD and ID testing, an individual 112 may be allowed to attempt to login two or more times, failing, before the failure limit is reached. In one embodiment, the number of failed attempts may be greater or fewer. If the limit has not yet been reached, the method may continue by recording the verification attempt information in the identification database 136 and/or the ESD information database 140. The verification attempt may record a timestamp associated with the attempted login and a reason why the attempted login failed (e.g., failed electrical ground-path test or ID authorization, etc.). In one embodiment, the verification attempt may be recorded in the login history data field 318 of the data structure 300 associated with the identification database 136. The method may then return to initiate the electrical ground-path test result at step 404, and repeat the process.

In some embodiments, a predetermined number of failed tests (e.g., the number of failed electrical ground-path tests or failed ID verification attempts) may have been reached, at which point, the method may proceed by recording the verification attempt information (step 448). This failed verification attempt information may be recorded in the login history data field 318 of the data structure 300 associated with the identification database 136. In some embodiments, a notification may be sent to a supervisor via the manufacturing workstation 116 regarding the failed login attempt. In one embodiment, the failed login attempt may be rendered to a display device associated with the manufacturing workstation 116.

The method continues by restricting access to the manufacturing workstation 116 and/or an operational functionality of the manufacturing workstation 116 (step 452). In some embodiments, restricting access may include locking the manufacturing workstation 116, preventing an individual 112 from accessing a portion of the manufacturing workstation 116, and/or otherwise preventing the manufacturing workstation 116 from functioning.

In addition to the embodiments described above, the present disclosure offers a number of additional benefits and features. For instance, the present disclosure provides a verification system that checks both the electrical-ground path for an individual 112 and an identity of an individual 112 before access to a manufacturing workstation 116, such as a machine or portion of an assembly line, can be accessed. The method may require periodic testing to ensure that the authorized individual 112 is still present at the manufacturing workstation 116 and passes the electrical ground-path test for the manufacturing workstation 116. Requiring a passing result for the electrical ground-path test as well as a positive ID of the individual 112 ensures that anyone working at the manufacturing workstation 116 is safely grounded and authorized to work at the manufacturing workstation 116.

As should be appreciated by one skilled in the art, aspects of the present disclosure have been illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, microcode, etc.) or combining software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure have been described herein with reference to flowchart illustrations and/or block diagrams of methods, apparatuses (systems) and computer program products according to embodiments of the disclosure. It should be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

What is claimed is:

1. An electrostatic discharge (ESD) and biometric identification verification system, comprising:
    a biometric feature scanning device;
    an ESD grounding test device coupled to the biometric feature scanning device;
    a processor coupled to the biometric feature scanning device and the ESD grounding test device; and
    a memory coupled with and readable by the processor and storing therein instructions that, when executed by the processor, cause the processor to:
       initiate, via the biometric feature scanning device, a biometric scan of an object within a scanning zone of the biometric feature scanning device;
       determine, based on the biometric scan, biometric information for the object;
       receive, from the ESD grounding test device, a result of an electrical ground-path test for the object while the object is within the scanning zone of the biometric feature scanning device; and
       determine to grant operational access to a manufacturing workstation in response to the result of the electrical ground-path test indicating the object is electrically-grounded relative to the manufacturing workstation.

2. The system of claim 1, wherein the biometric feature scanning device comprises a fingerprint sensor and wherein contact by the object with the fingerprint sensor closes an electrical circuit between an electrical-ground associated with the object and an electrical-ground associated with the ESD grounding test device.

3. The system of claim 1, wherein determining to grant operational access comprises instructions that further cause the processor to:
    determine the biometric information for the object matches an authorized record for an individual associated with the record.

4. The system of claim 1, wherein the electrical ground-path test is initiated in response to the object making contact with the scanning zone.

5. The system of claim 4, wherein the biometric scan of the object and the electrical ground-path test for the object are initiated substantially simultaneously.

6. The system of claim 1, wherein the operational access to the manufacturing workstation is restricted in response to the result of the electrical ground-path test indicating the object is not electrically-grounded relative to the manufacturing workstation.

7. The system of claim 1, wherein prior to determining to grant operational access to the manufacturing workstation, the instructions further cause the processor to:
    access a memory device via a communication network; and
    retrieve, from a memory location on the memory device, an impedance range that defines when the object is electrically-grounded relative to the manufacturing workstation.

8. The system of claim 7, wherein the instructions further cause the processor to:
    record, in the memory device and in association with the memory location, an impedance measured by the ESD grounding test device during the electrical ground-path test, and wherein the impedance measured is recorded along with the biometric information for the object.

9. The system of claim 1, wherein the instructions further cause the processor to:
    render, to a display, an alert requesting a subsequent electrical ground-path test for the object; and
    restrict operational access to the manufacturing workstation until the subsequent electrical ground-path test for the object indicates the object is electrically-grounded relative to the manufacturing workstation and the biometric information for the object matches an authorized record for the object.

10. A method for verifying an electrostatic discharge (ESD) state and biometric identification (ID) for an individual, comprising:
    initiating, via a biometric feature scanning device of a manufacturing workstation, a biometric scan of the individual within a scanning zone of the biometric feature scanning device;
    determining, by a processor and based on the biometric scan, a biometric ID for the individual;
    receiving, from an ESD grounding test device of the manufacturing workstation, a result of an electrical ground-path test for the individual while the individual is within the scanning zone of the biometric feature scanning device; and
    determining, by the processor, to grant access to a function of the manufacturing workstation when the result of the electrical ground-path test indicates the individual is electrically-grounded relative to the manufacturing workstation and the biometric ID for the individual matches an authorized record for the individual.

11. The method of claim 10, wherein the biometric feature scanning device comprises a fingerprint sensor and wherein contact by the individual with an ESD test pad of the fingerprint sensor closes an electrical circuit between an electrical-ground associated with the individual and an electrical-ground associated with the ESD grounding test device.

12. The method of claim 11, further comprising:
    using the contact by the individual with the fingerprint sensor as a trigger to initiate the electrical ground-path test.

13. The method of claim 12, wherein the biometric scan of the individual and the electrical ground-path test for the individual are initiated substantially simultaneously.

14. The method of claim 12, wherein the access to the function of the manufacturing workstation is restricted when the result of the electrical ground-path test indicates something other than the individual being electrically-grounded relative to the manufacturing workstation.

15. The method of claim 12, wherein prior to determining to grant access to the function of the manufacturing workstation, the method further comprises:
    accessing, by the processor and across a communication network, a memory device; and
    retrieving, by the processor from a memory location on the memory device, an impedance range that defines when the individual is electrically-grounded relative to the manufacturing workstation.

16. The method of claim 12, further comprising:
accessing, by the processor and across a communication network a memory device; and
recording, in a memory location on the memory device, an impedance measured by the ESD grounding test device during the electrical ground-path test, and wherein the impedance measured is recorded along with the biometric ID for the individual.

17. The method of claim 12, further comprising:
determining, by the processor, a subsequent electrical ground-path test is required for the individual; and
restricting, by the processor, access to the function of the manufacturing workstation until the subsequent electrical ground-path test for the individual is performed and indicates the individual is electrically-grounded relative to the manufacturing workstation and the biometric ID for the individual matches the authorized record for the individual.

18. A manufacturing apparatus, comprising:
a contact-based biometric feature scanning device that scans a fingerprint of an individual for identification information;
an electrostatic discharge (ESD) grounding test device coupled to the contact-based biometric feature scanning device that initiates an electrical ground-path test for the individual in response to the individual contacting the contact-based biometric feature scanning device; and
a processor coupled to the contact-based biometric feature scanning device and the ESD grounding test device that controls an operation of the manufacturing apparatus based on the identification information and a result of the electrical ground-path test.

19. The manufacturing apparatus of claim 18, further comprising:
an ESD controlled work area, and wherein controlling the operation of the manufacturing apparatus controls operational access to the ESD controlled work area.

20. The manufacturing apparatus of claim 19, wherein the processor determines to grant operational access to the ESD controlled work area in response to the result of the electrical ground-path test indicating the individual is electrically-grounded relative to the ESD controlled work area, and wherein the processor determines to restrict operational access to the ESD controlled work area in response to the result of the electrical ground-path test indicating the individual is not electrically-grounded relative to the ESD controlled work area.

* * * * *